US008736387B2

(12) United States Patent
Mahooti et al.

(10) Patent No.: US 8,736,387 B2
(45) Date of Patent: May 27, 2014

(54) CHOPPER BASED RELAXATION OSCILLATOR

(75) Inventors: Kevin Mahooti, Sunnyvale, CA (US); Min Ming Tarng, San Jose, CA (US); Jason Sharma, Milpitas, CA (US); Hassan Sharghi, Milpitas, CA (US); Himanshu Sharma, San Jose, CA (US); Amjad Nezami, Mountain View, CA (US)

(73) Assignee: NXP B.V., Eindhoven (NL)

( * ) Notice: Subject to any disclaimer, the term of this patent is extended or adjusted under 35 U.S.C. 154(b) by 49 days.

(21) Appl. No.: 13/556,520

(22) Filed: Jul. 24, 2012

(65) Prior Publication Data

US 2014/0028409 A1 Jan. 30, 2014

(51) Int. Cl.
*H03K 3/0231* (2006.01)
*H03L 1/02* (2006.01)

(52) U.S. Cl.
USPC ............................ 331/143; 331/176; 331/185

(58) Field of Classification Search
USPC ............................ 331/57, 111, 143, 176, 185
See application file for complete search history.

(56) References Cited

U.S. PATENT DOCUMENTS 5,796,313 A * 8/1998 Eitan ............................... 331/57
6,020,792 A * 2/2000 Nolan et al. .................. 331/111
6,985,040 B2 * 1/2006 Kim ................................ 331/16
7,138,879 B2 * 11/2006 Su .................................. 331/74
7,876,163 B2 * 1/2011 Hachigo .......................... 331/16
7,884,679 B2 * 2/2011 Mahooti ....................... 331/143
8,004,266 B2 * 8/2011 Consoer ........................ 323/314
8,138,847 B1 * 3/2012 Maley ........................... 331/186
8,212,627 B2 * 7/2012 Yang et al. .................... 331/179
2010/0237955 A1 9/2010 Mohooti

OTHER PUBLICATIONS

Ge, Guang, et al.; "A Single-Trim CMOS Bandgap Reference with a 3 Inaccuracy of ± 0.15% from −40° C. to 125° C.", IEEE International Solid-State Circuits Conference, 2010, p. 9-11.
Kugelstadt, Thomas; "Auto-sero amplifiers ease the design of high-precision circuits"; Analog Applications Journal; 2005; p. 19-28.

* cited by examiner

*Primary Examiner* — Levi Gannon

(57) ABSTRACT

A reference circuit, an oscillator architecture that includes the reference circuit and a method for operating the reference circuit are described. In one embodiment, the reference circuit includes a voltage reference generator configured to generate a reference voltage and a current reference generator configured to generate a reference current based on the reference voltage. The current reference generator includes a level shifter circuit configured to generate intermediate voltages based on the reference voltage, a first current reference circuit configured to generate intermediate currents based on the intermediate voltages, where the intermediate currents are correlated to the reference voltage, and a second current reference circuit configured to combine the intermediate currents to generate the reference current. Other embodiments are also described.

17 Claims, 9 Drawing Sheets

CHOPPER BASED RELAXATION OSCILLATOR

Embodiments described herein relate generally to electronic circuits and, more particularly, to reference circuits, oscillator architectures that include the reference circuits, and methods for operating the reference circuits.

A reference circuit can generate a reference voltage and a reference current, which can be used by various devices and applications. For example, the reference voltage and the reference current can be used by an oscillator for the generation of oscillation signals. Performance of an electric circuit that operates based on the reference voltage and the reference current from a reference circuit is dependent on the accuracy of the reference voltage and the reference current. For example, in an oscillator, the accuracy of the oscillation signals is largely dependent on the accuracy of the reference voltage and the reference current that is input into the oscillator. In particular, the stability of the oscillating frequency with respect to temperature can be dependent upon the reference voltage. In addition, the operating temperature range of the oscillator can be limited by the dependency of the oscillating frequency on the reference voltage. However, the reference voltage may be unstable, which can negatively affect the performance of the electric circuit that operates based on the reference voltage. Therefore, there is a need for a reference circuit and a method for operating such a reference circuit that is not so dependent on the stability of the reference voltage.

A reference circuit, an oscillator architecture that includes the reference circuit and a method for operating the reference circuit are described. In one embodiment, the reference circuit includes a voltage reference generator configured to generate a reference voltage and a current reference generator configured to generate a reference current based on the reference voltage. The current reference generator includes a level shifter circuit configured to generate intermediate voltages based on the reference voltage, a first current reference circuit configured to generate intermediate currents based on the intermediate voltages, where the intermediate currents are correlated to the reference voltage, and a second current reference circuit configured to combine the intermediate currents to generate the reference current. Other embodiments are also described.

In an embodiment, an oscillator architecture includes a reference circuit and a relaxation oscillator. The reference circuit includes a voltage reference generator configured to generate a reference voltage and a current reference generator configured to generate a reference current based on the reference voltage. The current reference generator includes a level shifter circuit configured to generate intermediate voltages based on the reference voltage, a first current reference circuit configured to generate intermediate currents based on the intermediate voltages, where the intermediate currents are correlated to the reference voltage, and a second current reference circuit configured to combine the intermediate currents to generate the reference current. The relaxation oscillator is configured to generate oscillation signals based on the reference voltage and the reference current. The relaxation oscillator includes a timing voltage generation circuit configured to generate a timing voltage output based on the reference current, a voltage to time converter configured to generate a capacitance discharging based on the timing voltage and the reference voltage, and an output frequency generator configured to generate the oscillation signals based on the capacitance discharging.

In an embodiment, a method for operating a reference circuit includes generating a reference voltage using frequency chopping and curvature compensation and generating a reference current based on the reference voltage. Generating the reference current includes generating intermediate voltages based on the reference voltage, generating intermediate currents based on the intermediate voltages, where the intermediate currents are correlated to the reference voltage, and combining the intermediate currents to generate the reference current.

Other aspects of embodiments in accordance with the invention will become apparent from the following detailed description, taken in conjunction with the accompanying drawings, depicted by way of embodiments in accordance with the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
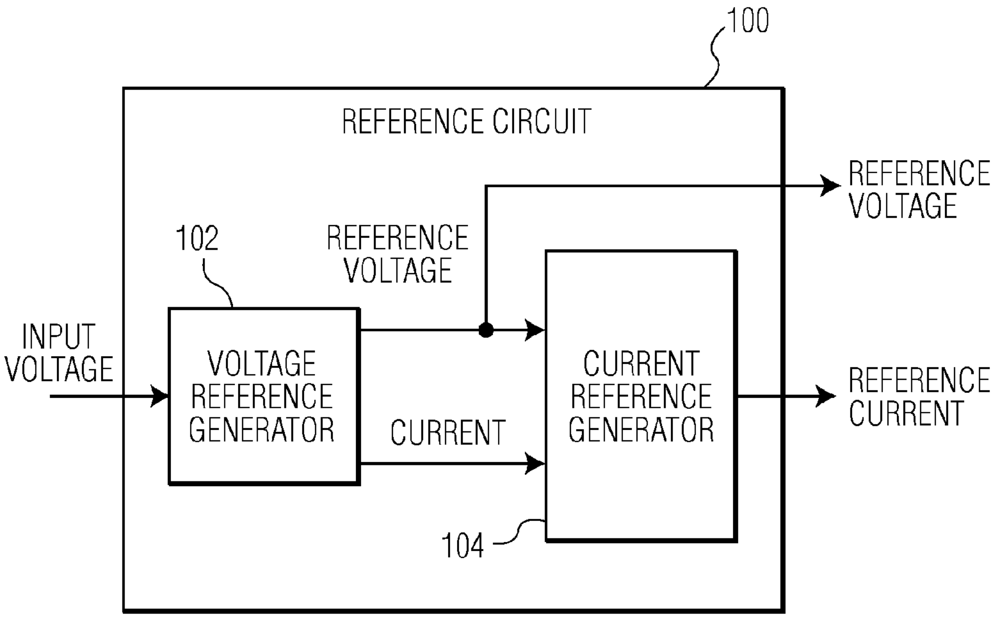
FIG. 1 is a schematic block diagram of a reference circuit in accordance with the invention.

FIG. 1 is a schematic block diagram of a reference circuit 100 of an embodiment in accordance with the invention. The reference circuit is configured to generate a reference voltage and a reference current. The reference voltage and the reference current can be used for various devices and applications. For example, the reference voltage and the reference current can be used by an oscillator for the generation of oscillation signals.

In the embodiment depicted in FIG. 1, the reference circuit 100 includes a voltage reference generator 102 and a current reference generator 104. The voltage reference generator 102 is configured to generate a reference voltage and a transitional current to be used to generate the reference current. The current reference generator 104 is configured to generate the reference current based on the reference voltage and the current from the voltage reference generator 102.

In an embodiment, the voltage reference generator 102 is a chopper stabilized voltage reference generator that uses frequency chopping and curvature compensation techniques. For an oscillator circuit that operates based on a reference voltage, the combination of chopper stabilization and curvature compensation techniques can reduce the first order dependence and the second order dependence of the circuit's performance on the reference voltage with respect to the variation of operating temperature. Consequently, the variation of the oscillating frequency over the operating temperature range can be reduced. In addition, for oscillators that receive the same reference voltage and reference current, all of the frequency versus temperature curves can have the same or similar shape. Because the frequency versus temperature curves can have the same or similar shape, the calibration of the oscillators can be shortened, for example, by setting the oscillator frequency at a single temperature point.

Figure 2:
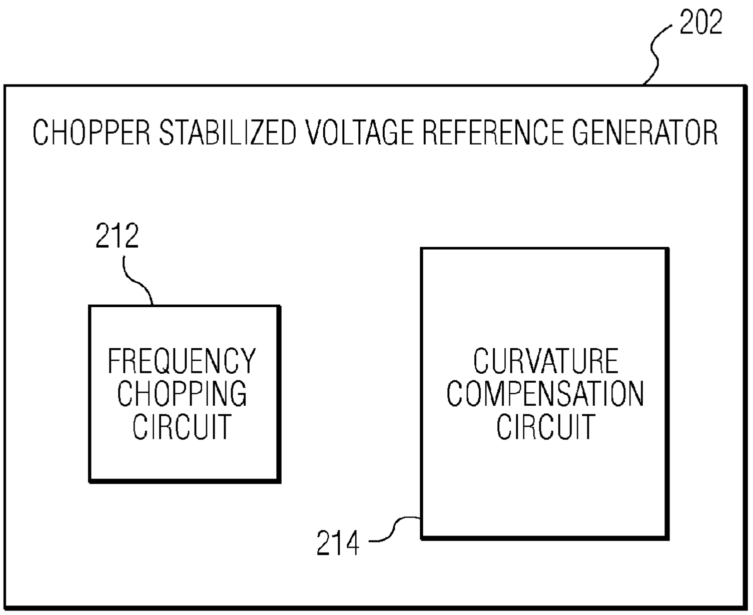
FIG. 2 depicts a chopper stabilized voltage reference generator in accordance with the invention.

FIG. 2 depicts a chopper stabilized voltage reference generator 202 of an embodiment in accordance with the invention. In the embodiment depicted in FIG. 2, the voltage reference generator 202 includes a frequency chopping circuit 212 and a curvature compensation circuit 214. The frequency chopping circuit 212 is configured to process an input voltage based on a chopping frequency. The curvature compensation circuit 214 is configured to compensate for the variations of the input voltage that are caused by temperature fluctuations.

Figure 3:
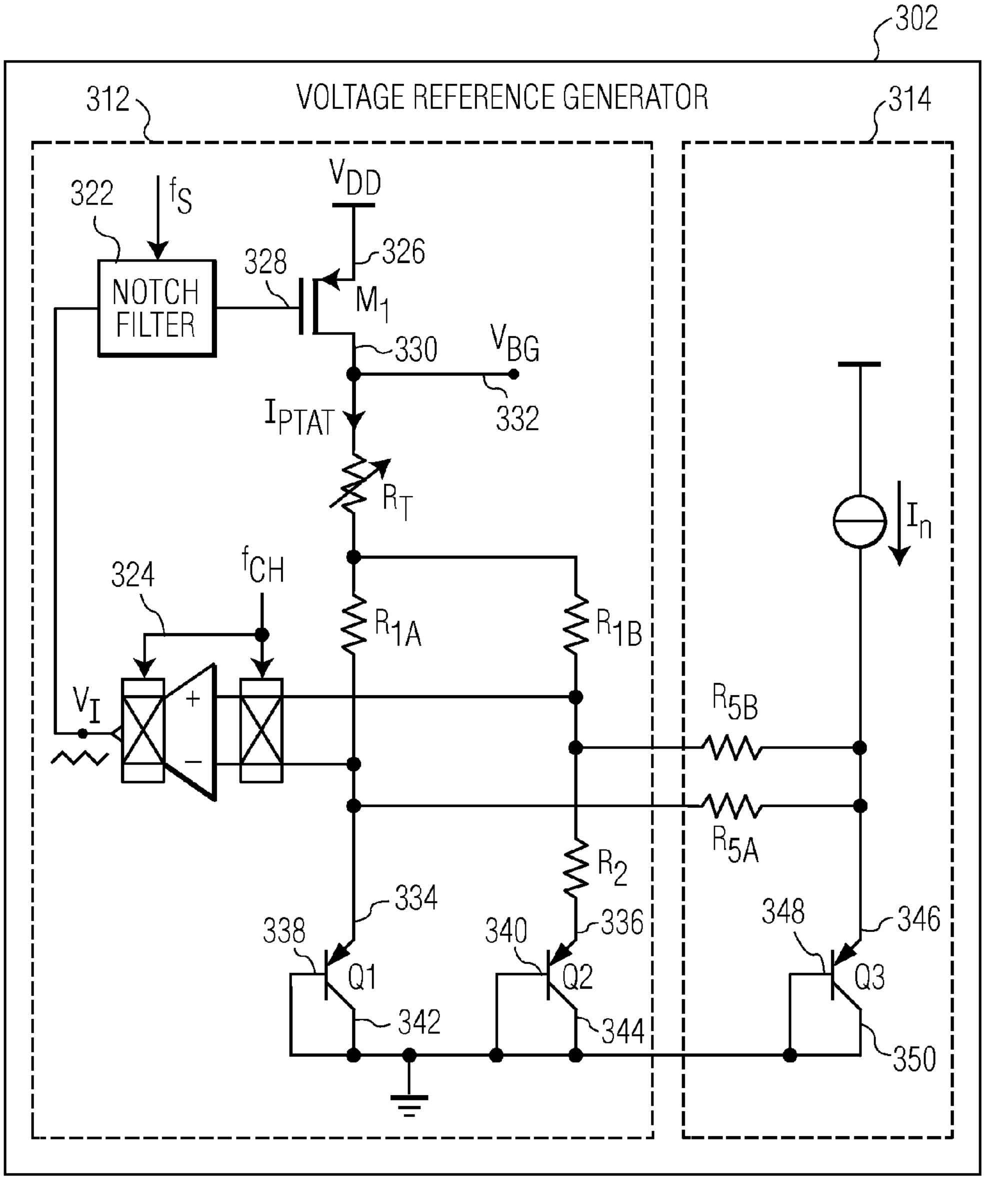
FIG. 3 depicts an embodiment of the chopper stabilized voltage reference generator depicted in FIG. 2.

FIG. 3 depicts an embodiment of the chopper stabilized voltage reference generator 202 depicted in FIG. 2. In the embodiment depicted in FIG. 3, a voltage reference generator 302 includes a voltage chopping circuit 312 and a curvature compensation circuit 314. The voltage reference generator 302 is configured to generate a band gap reference voltage "$V_{BG}$" and a current "$I_{ptat}$" based on an input voltage "$V_{DD}$" and a chopping frequency "$f_{ch}$." The voltage reference generator 302 is one of the possible implementations of the voltage reference generator 102. However, the voltage reference generator 102 can be implemented differently from the voltage reference generator 302 depicted in FIG. 3. Thus, the invention is not restricted to the particular implementation of the voltage reference generator 302 depicted in FIG. 3.

The voltage chopping circuit 312 includes metal-oxide-semiconductor field-effect transistor (MOSFET) "$M_1$," PNP transistors "$Q_1$" and "$Q_2$," resistors "$R_{1A}$," "$R_{1B}$," "$R_2$" and "$R_T$," a notch filter 322 and a frequency chopper circuit 324. The source terminal 326 of the transistor "$M_1$" is connected to receive the input voltage "$V_{DD}$," the gate terminal 328 of the transistor "$M_1$" is connected to the notch filter, and the drain terminal 330 of the transistor "$M_1$" is connected to the resistor "$R_T$." The drain terminal 330 of the transistor "$M_1$" is also connected to an output terminal 332, from which the output reference voltage "$V_{BG}$" is output. The emitter terminals 334, 336 of the transistors "$Q_1$" and "$Q_2$," respectively, are connected to the frequency chopper circuit and to the resistors "$R_{1A}$" and "$R_2$." The base terminal 338 and the collector terminal 342 of the transistor "$Q_1$" are connected to each other and to ground. The base terminal 340 and the collector terminal 344 of the transistor "$Q_2$" are connected to each other and to ground. The notch filter is configured to pass all frequencies except a frequency band that is centered on a center frequency. The frequency chopper circuit is configured to process the signals from the resistors "$R_{1A}$" and "$R_{1B}$" based on the chopping frequency "$f_{ch}$." In the embodiment depicted in FIG. 3, the transistor "$M_1$," the resistors "$R_{1A}$" and "$R_T$," the frequency chopper circuit, and the notch filter constitute a feedback loop. The transistors "$Q_1$" and "$Q_2$" and the resistors "$R_{1A}$," "$R_{1B}$," and "$R_2$" constitute an amplifier.

The curvature compensation circuit 314 includes a current source "$I_n$," a PNP transistor "$Q_3$" and resistors "$R_{5A}$" and "$R_{5B}$." The emitter terminal 346 of the transistor "$Q_3$" is connected to the current source "$I_n$," and to the resistors "$R_{5A}$" and "$R_{5B}$." The base terminal 348 and the collector terminal 350 of the transistor "$Q_3$" are connected to each other and to ground.

In operation, the chopping of the input voltage "$V_I$" from the notch filter 322 can be considered as an amplitude modulation (AM), with the chopping frequency, $f_{CH}$, being the carrier, and the input voltage "$V_I$" representing the modulating signal. For example, the frequency chopping can cause sidebands of a square wave to appear on both sides of the odd harmonics of the chopper frequency. The modulated signal is amplified by an amplifier that is formed by the transistors "$Q_1$" and "$Q_2$" and the resistors "$R_{1A}$," "$R_{1B}$," and "$R_2$." The amplified signal is fed back to the transistor "$M_1$" via the notch filter 322 and the frequency chopper circuit 324. The PNP transistor "$Q_3$" is biased at current "$I_n$," which is nearly temperature-independent. Because the current that flows through the transistors "Q1" and "Q2" is nominally proportional to absolute temperature (PTAT), the voltage difference between the emitter terminals 336, 346 of the transistors "$Q_1$" and "$Q_3$" is non-PTAT. The resulting currents in the resistors "$R_{5A}$" and "$R_{5B}$" generate curvature-correcting voltages across the resistors "$R_{1A}$," "$R_{1B}$" and "$R_T$." The voltage "$V_{BG}$" at the drain terminal 330 of the transistor "$M_1$" is output from the output terminal 332 as the reference voltage of the voltage reference generator 302.

Figure 4:
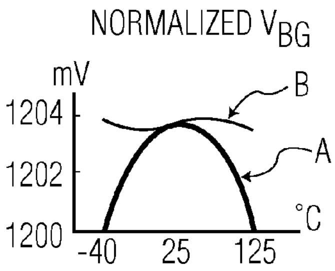
FIG. 4 is a diagram that depicts a reference voltage of the voltage reference generator depicted in FIG. 3 as a function of the operating temperature.

FIG. 4 is a diagram that depicts the band gap reference voltage "$V_{BG}$" of the voltage reference generator 302 as a function of the operating temperature. The X-axis of the diagram represents the operating temperature and the Y-axis of the diagram represents the band gap reference voltage "$V_{BG}$." As indicated by curve "A" of FIG. 4, the reference voltage "$V_{BG}$" fluctuates slightly between 1200 milliVolts (mVs) and 1204 mVs in an operating temperature range between minus 40 degree and 125 degree. As indicated by curve "B" of FIG. 4, the normalized reference voltage "$V_{bg}$" is substantially constant.

Turning back to FIG. 1, the current reference generator 104 of the reference circuit 100 is configured to generate a reference current. In an embodiment, the current reference generator 104 receives the bandgap reference voltage and the proportional to absolute temperature (PTAT) current from the voltage reference generator and generates a band gap reference current, which is referred to herein as "$I_{BG}$."

Performance of a circuit that operates based on the reference voltage and the reference current from the reference circuit 100 is at least partially dependent upon the reference voltage and the reference current. In an embodiment, the reference circuit 100 is configured such that the reference voltage is correlated with the reference current. The correlation between the reference voltage and the reference current can improve the performance of a circuit that operates based on the reference voltage and the reference current. For example, compared to an uncorrelated reference voltage and reference current, the performance of an oscillator (e.g., the stability of the oscillating frequency with respect to temperature) can be improved if a correlated reference voltage and reference current are input into the oscillator. In some cases, the performance of an oscillator that operates based on a correlated reference voltage and reference current can be independent of the reference voltage in a first order. However, even with the correlated reference voltage and reference current, the performance of the oscillator may still be dependent on the reference voltage in a second order. For example, the achievable accuracy of the oscillator and the operating temperature range of the oscillator can be limited by the second order dependency of the oscillating frequency on the reference voltage. Without cancelling the second order effects, even though a relatively high accuracy of the oscillation signal is achievable, the operating temperature range will be limited under the relatively high accuracy requirement. To further improve the performance of an oscillator, the second order dependency needs to be addressed.

Figure 5:
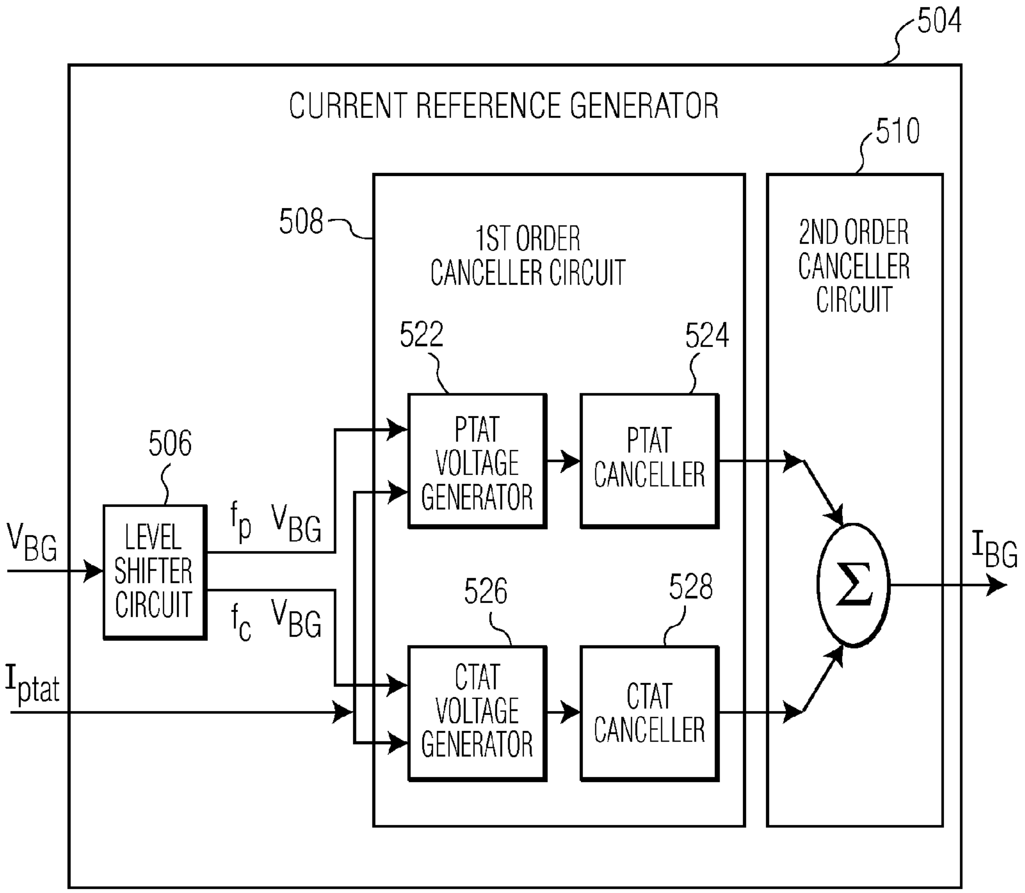
FIG. 5 depicts an embodiment of a current reference generator that provides a second order temperature compensated current reference.

In one embodiment, the second order dependency of the oscillating frequency on the reference voltage is addressed by curvature compensation of the reference current, which generates a second order temperature compensated current reference that has a relatively small variation over the operating temperature range. FIG. 5 depicts an embodiment of the current reference generator 104 of FIG. 1 that provides a second order temperature compensated current reference. In the embodiment depicted in FIG. 5, a current reference generator 504 includes a level shifter circuit 506, a first order canceller circuit 508, and a second order canceller circuit 510. The current reference generator 504 is one of the possible implementations of the current reference generator 104. Thus, the current reference generator 104 can be implemented differently from the current reference generator 504 depicted in FIG. 5.

Figure 6A:
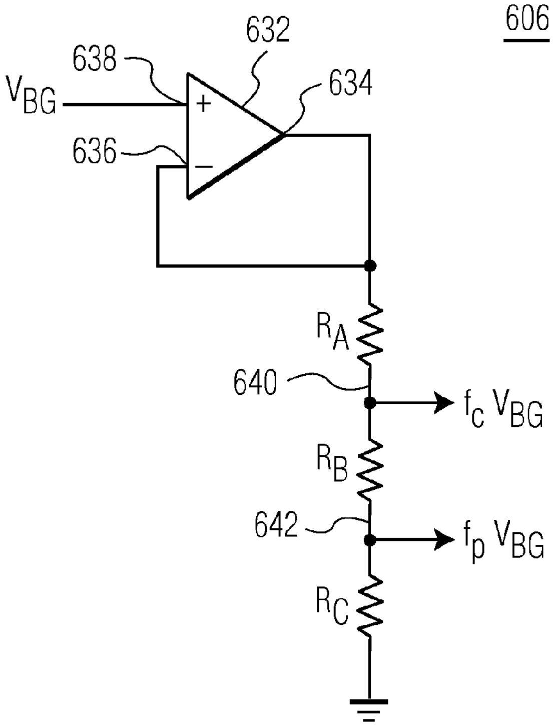
FIG. 6A depicts an embodiment of a level shifter circuit of the current reference generator of FIG. 5.

The level shifter circuit 506 is configured to generate multiple intermediate voltages based on the reference voltage "$V_{BG}$" from the voltage reference generator 102. In an embodiment, the level shifter circuit 506 is configured to multiply the reference voltage "$V_{BG}$" with multiple coefficients to generate multiple intermediate voltages. FIG. 6A depicts an embodiment of the level shifter circuit 506 of FIG. 5, which is configured to multiply the reference voltage by two coefficients, "$f_p$" and "$f_c$." In the embodiment depicted in FIG. 6A, a level shifter circuit 606 includes a voltage comparator 632 and resistors "$R_A$," "$R_B$," and "$R_C$." The level shifter circuit implements a closed loop active feedback mechanism. In particular, the output terminal 634 of the voltage comparator 632 is connected to the negative input terminal 636 of the voltage comparator 632 while the reference voltage "$V_{BG}$" is input into the positive input terminal 638 of the voltage comparator 632. Because the output signal of the voltage comparator 632 is fed back as an input to the voltage comparator 632, the voltage at the output terminal 634 of the voltage comparator 632 closely follows the reference voltage "$V_{BG}$." The output terminal 634 of the voltage comparator 662 is also connected to ground through the resistors "$R_A$," "$R_B$" and "$R_C$." Because the output voltage of the voltage comparator 632 closely follows the reference voltage "$V_{BG}$" and the voltage comparator 632 is connected to ground through the resistors "$R_A$," "$R_B$," and "$R_C$," the voltage at the terminal 642 between the resistors "$R_B$" and "$R_C$" and the voltage at the terminal 640 between the resistors "$R_A$" and "$R_B$" can be controlled by setting the resistances of the resistors "$R_A$," "$R_B$," and "$R_C$."

Figure 6B:
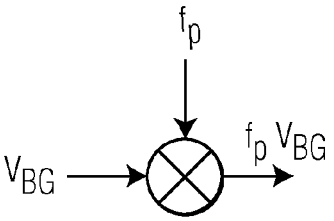
FIGS. 6B and 6C are signal diagrams of some operations of the level shifter circuit of FIG. 6A.
Figure 6C:
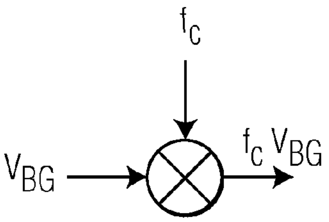

In operation, the level shifter circuit 606 multiplies the reference voltage "$V_{BG}$" from the voltage reference generator by coefficients "$f_p$" and "$f_c$" to generate two output voltages "$f_pV_{BG}$" and "$f_cV_{BG}$," as illustrated in the signal diagrams of FIGS. 6B and 6C. In this operation, the voltage at the terminal 642 between the resistors "$R_B$" and "$R_C$" and the voltage at the terminal 640 between the resistors "$R_A$" and "$R_B$" are controlled by setting the resistances of the resistors "$R_A$," "$R_B$," and "$R_C$."

Turning backing to FIG. 5, the first order canceller circuit 508 is configured to perform first order curvature compensation by generating currents that are correlated to the reference voltage from the voltage reference generator 102. In the embodiment depicted in FIG. 5, the first order canceller circuit includes a first circuit branch that includes a proportional to absolute temperature (PTAT) voltage generator 522 and a PTAT canceller 524 and a second circuit branch that includes a complementary to absolute temperature (CTAT) voltage generator 526 and a CTAT canceller 528. The PTAT voltage generator and the PTAT canceller are located in a first signal path while the CTAT voltage generator and the CTAT canceller are located in a second path that is in parallel with the first signal path.

Figure 7A:
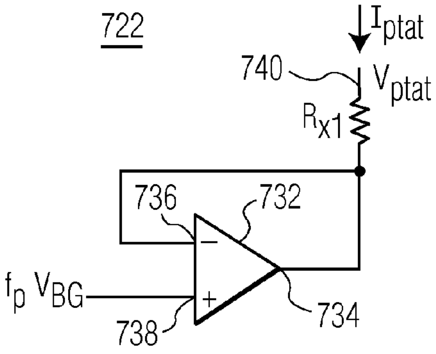
FIG. 7A depicts an embodiment of a proportional to absolute temperature (PTAT) voltage generator of the current reference generator of FIG. 5.

The PTAT voltage generator 522 is configured to receive an output voltage "$f_p V_{BG}$" from the level shifter circuit 506 and an output current from the voltage reference generator 102 and to generate a PTAT reference voltage. FIG. 7A depicts an embodiment of the PTAT voltage generator 522 of FIG. 5. In the embodiment depicted in FIG. 7A, a PTAT voltage generator 722 includes a voltage comparator 732 and a resistor "$R_{x1}$." Similar to the level shifter circuit 606 of FIG. 6A, the PTAT voltage generator 732 of FIG. 7A implements a closed loop active feedback mechanism, which keeps the voltage at the output terminal 734 of the voltage comparator 732 closely following an output voltage from the level shifter circuit 506/606. In particular, the output terminal 734 of the voltage comparator 732 is connected to the negative input terminal 736 of the voltage comparator 732 while the output voltage "$f_p V_{BG}$" from the level shifter circuit 506/606 is input into the positive input terminal 738 of the voltage comparator. Because the output signal of the voltage comparator 732 is fed back as an input to the voltage comparator 732, the voltage at the output terminal of the voltage comparator 732 closely follows the output voltage from the level shifter circuit 506/606. The output terminal 734 of the voltage comparator 732 is also connected to the resistor "$R_{x1}$," from which the current "$I_{ptat}$" from the voltage reference generator 102, 202, or 302 is received. The voltage at the terminal 740 of the resistor "$R_{x1}$" can be controlled by setting the resistance of the resistor "$R_{x1}$."

Figure 7B:
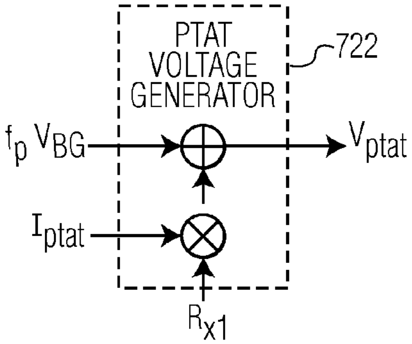
FIG. 7B is a signal diagram of an operation of the PTAT voltage generator of FIG. 7A.

In operation, the PTAT voltage generator 722 generates a reference voltage "$V_{ptat}$" based on the output voltage "$f_p V_{BG}$" from the level shifter circuit 606, the current "$I_{ptat}$" from the voltage reference generator 302, and the resistance value of the resistor "$R_{1x}$," as illustrated in the signal diagram of FIG. 7B. The reference voltage "$V_{ptat}$," the output voltage "$f_p V_{BG}$" and the current "$I_{ptat}$" in the signal diagram Fig. of 7B satisfy the equation:

$$V_{ptat}=f_p \times V_{BG}+I_{ptat} \times R_{x1} \tag{1}$$

Figure 8A:
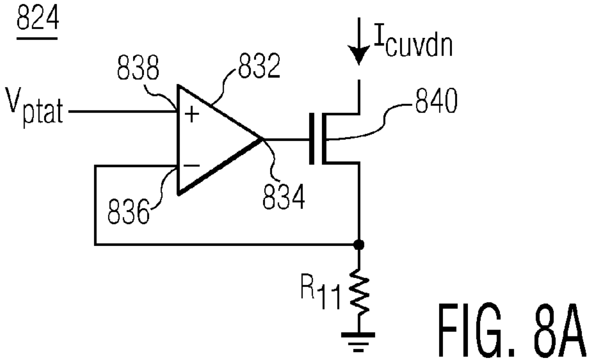
FIG. 8A depicts an embodiment of a PTAT canceller of the current reference generator of FIG. 5.

Turning back to FIG. 5, the voltage generated by the PTAT voltage generator 522 is output into the PTAT canceller 524, which is configured to generate a current based on the received voltage. FIG. 8A depicts an embodiment of the PTAT canceller 524 of FIG. 5. In the embodiment depicted in FIG. 8A, a PTAT canceller 824 includes a voltage comparator 832, a transistor 840, and a resistor "$R_{11}$" Similar to the level shifter circuit 606 of FIG. 6A and the PTAT voltage generator 722 of FIG. 7A, the PTAT canceller 824 of FIG. 8A implements a closed loop active feedback mechanism, which keeps the voltage at the output terminal 834 of the voltage comparator 832 closely following the output voltage from the PTAT voltage generator 622. In particular, the output terminal 834 of the voltage comparator 832 is connected to the negative input terminal 836 of the voltage comparator through the transistor 840 while the output voltage from the PTAT voltage generator is input into the positive input terminal 838 of the voltage comparator 832. Because the output signal of the voltage comparator 832 is fed back as an input to the voltage comparator 832, the output voltage of the voltage comparator 832 closely follows the output voltage "$V_{ptat}$" from the PTAT voltage generator. The negative terminal 836 of the voltage comparator 832 is also connected to the resistor "$R_{11}$," which is connected to ground. The output of the voltage comparator 832 controls the transistor 840. A current "$I_{cuvdn}$" flows into the transistor 840 and to ground through the resistor "$R_{11}$."

Figure 8B:
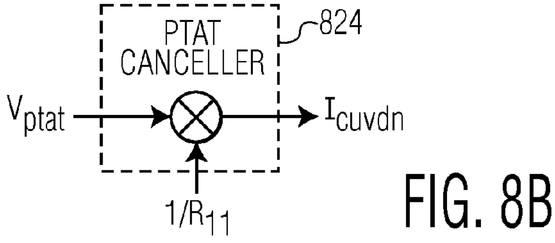
FIG. 8B is a signal diagram of an operation of the PTAT canceller of FIG. 8A.

In operation, the PTAT canceller 824 generates the current "$I_{cuvdn}$" based on the output voltage "$V_{ptat}$" from the PTAT voltage generator 722 and the in resistance value of the resistor "$R_{11}$," as illustrated in the signal diagram of FIG. 8B. The reference voltage "$V_{ptat}$" and the current "$I_{cuvdn}$" in the signal diagram of FIG. 8B satisfy the equation:

$$I_{cuvdn} = \frac{V_{ptat}}{R_{11}} \tag{2}$$

Figure 9A:
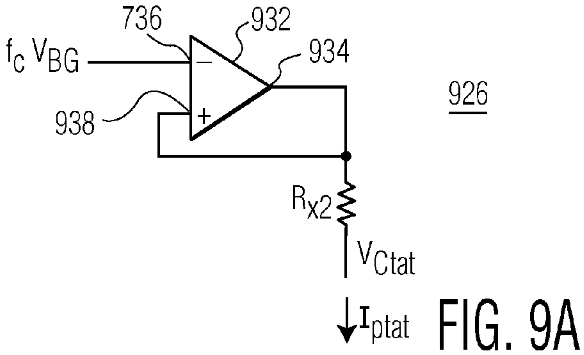
FIG. 9A depicts an embodiment of a complementary to absolute temperature (CTAT) voltage generator of the current reference generator of FIG. 5.

Turning backing to FIG. 5, the CTAT voltage generator 526 is configured to receive an output voltage "$f_c V_{BG}$" from the level shifter circuit 506 and an output current from the voltage reference generator 102 and to generate a complementary to absolute temperature (CTAT) reference voltage. FIG. 9A depicts an embodiment of the CTAT voltage generator 526 of FIG. 5. In the embodiment depicted in FIG. 9A, a CTAT voltage generator 926 includes a voltage comparator 932 and a resistor "$R_{x2}$." Similar to the level shifter circuit 606 of FIG. 6A, the CTAT voltage generator 926 of FIG. 9A implements a closed loop active feedback mechanism, which keeps the voltage at the output terminal 934 of the voltage comparator 932 closely following the output voltage from the level shifter circuit 506/606. In particular, the output terminal 934 of the voltage comparator 932 is connected to the positive input terminal 938 of the voltage comparator 932 while the output voltage from the level shifter circuit 506 is input into the negative input terminal of the voltage comparator. Because the output signal of the voltage comparator 932 is fed back as an input to the voltage comparator 932, the voltage at the output terminal 934 of the voltage comparator 932 closely follows the output voltage from the level shifter circuit 506/606. The output terminal 934 of the voltage comparator 932 is also connected to the resistor "$R_{x2}$," from which the current "$I_{ptat}$" from the voltage reference generator is received.

Figure 9B:
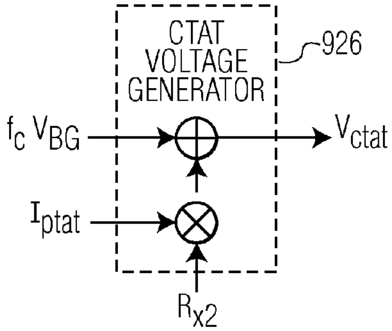
FIG. 9B is a signal diagram of an operation of the CTAT voltage generator of FIG. 9A.

In operation, the CTAT voltage generator 926 generates a reference voltage "$V_{ctat}$" based on the output voltage "$f_c V_{BG}$" from the level shifter circuit 506, the current "$I_{ptat}$" from the voltage reference generator 102, and the resistance value of the resistor "$R_{2x}$," as illustrated in the signal diagram of FIG. 9B. The reference voltage "$V_{ctat}$," the output voltage "$f_c V_{BG}$" and the current "$I_{ptat}$" in the signal diagram of FIG. 9B satisfy the equation:

$$V_{ctat}=f_c \times V_{BG}+I_{ptat} \times R_{x2} \tag{3}$$

Figure 10A:
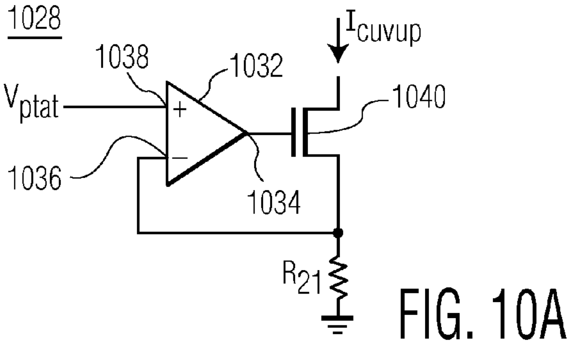
FIG. 10A depicts an embodiment of a CTAT canceller of the current reference generator of FIG. 5.

Turning backing to FIG. 5, the voltage generated by the CTAT voltage generator 526 is output into the CTAT canceller 528, which is configured to generate a current based on the received voltage. FIG. 10A depicts an embodiment of the CTAT canceller 528 of FIG. 5. In the embodiment depicted in FIG. 10A, a CTAT canceller 1028 includes a voltage comparator 1032, a transistor 1040 and a resistor "$R_{21}$." Similar to the level shifter circuit 606 of FIG. 6A and the CTAT voltage generator 926 of FIG. 9A, the CTAT canceller 1028 of FIG. 10A implements a closed loop active feedback mechanism, which keeps the voltage at the output terminal 1034 of the voltage comparator 1032 closely following the output voltage from the CTAT voltage generator 526. In particular, the output terminal 1034 of the voltage comparator 1032 is connected to the negative input terminal 1036 of the voltage comparator 1032 through the transistor 1040 while the output voltage from the CTAT voltage generator 526 is input into the positive input terminal 1038 of the voltage comparator 1032. Because the output signal of the voltage comparator 1032 is fed back as an input to the voltage comparator 1032, the voltage at the output terminal 1034 of the voltage comparator 1032 closely follows the output voltage from the CTAT voltage generator. The negative terminal 1036 of the voltage comparator 1032 is also connected to the resistor "$R_{21}$,"

which is connected to ground. The output of the voltage comparator 1032 controls the transistor 1040. A current "$I_{cuvup}$" flows into the transistor 1040 and to ground through the resistor "$R_{21}$."

Figure 10B:
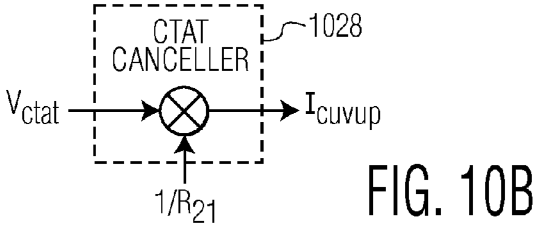
FIG. 10B is a signal diagram of an operation of the CTAT canceller of FIG. 10A.

In operation, the CTAT canceller 1028 generates the current "$I_{cuvup}$" based on the output voltage "$V_{ctat}$" from the CTAT voltage generator 526 and the resistance value of the resistor "$R_{21}$," as illustrated in the signal diagram of FIG. 10B. The reference voltage "$V_{ctat}$" and the current "$I_{cuvup}$" in the signal diagram of FIG. 10B satisfy the equation:

$$I_{cuvup} = \frac{V_{ctat}}{R_{21}} \tag{4}$$

Turning back to FIG. 5, the second order canceller circuit 510 is configured to perform second order curvature compensation. In particular, the second order canceller circuit 510 combines the currents from the PTAT canceller 524 and the CTAT canceller 528, in order to cancel the second order effect that is caused by variations in the operational temperature.

Figure 11A:
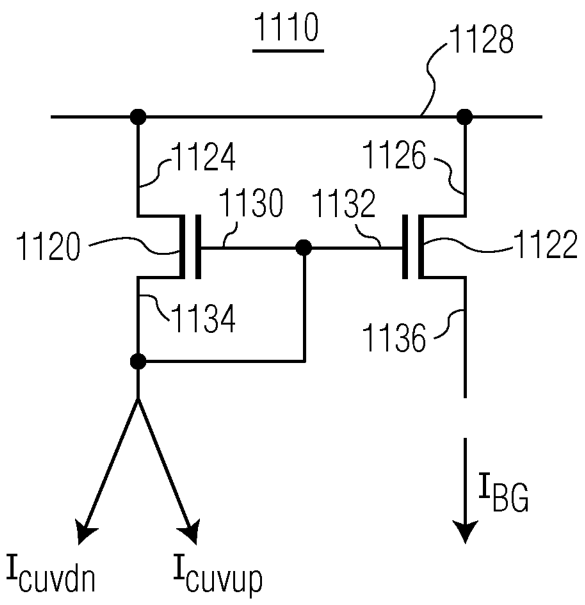
FIG. 11A depicts an embodiment of a second order canceller circuit of the current reference generator of FIG. 5.

FIG. 11A depicts an embodiment of the second order canceller circuit 510. In the embodiment depicted in FIG. 11A, a second order canceller circuit 1110 includes two transistors 1120, 1122 that form a current mirror. In particular, source terminals 1124, 1126 of the transistors 1120, 1122, respectively, are connected to a voltage rail 1128 and gate terminals 1130, 1132 of the transistors 1120, 1122, respectively, are connected to each other. The gate terminal 1130 of the transistor 1120 is also connected to the drain terminal 1134 of the transistor 1120. The output current "$I_{cuvdn}$" from the PTAT canceller 824 and the output current "$I_{cuvup}$" from the CTAT canceller 1028 flow out of the drain terminal 1134 of the transistor 1120 while the reference current "$I_{BG}$" is output from the drain terminal 1136 of the transistor 1122.

Figure 11B:
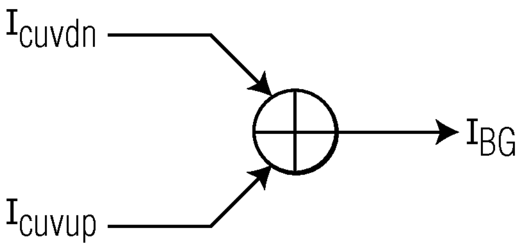
FIG. 11B is a signal diagram of an operation of the second order canceller circuit of FIG. 11A.

In operation, the second order canceller circuit 1110 generates the reference current "$I_{BG}$" as illustrated in the signal diagram of FIG. 11B. The currents "$I_{BG}$," "$I_{cuvdn}$" and "$I_{cuvup}$" in the signal diagram of FIG. 11B satisfy the equation:

$$I_{BG}=I_{cuvup}+I_{cuvdn} \tag{5}$$

Figure 12:
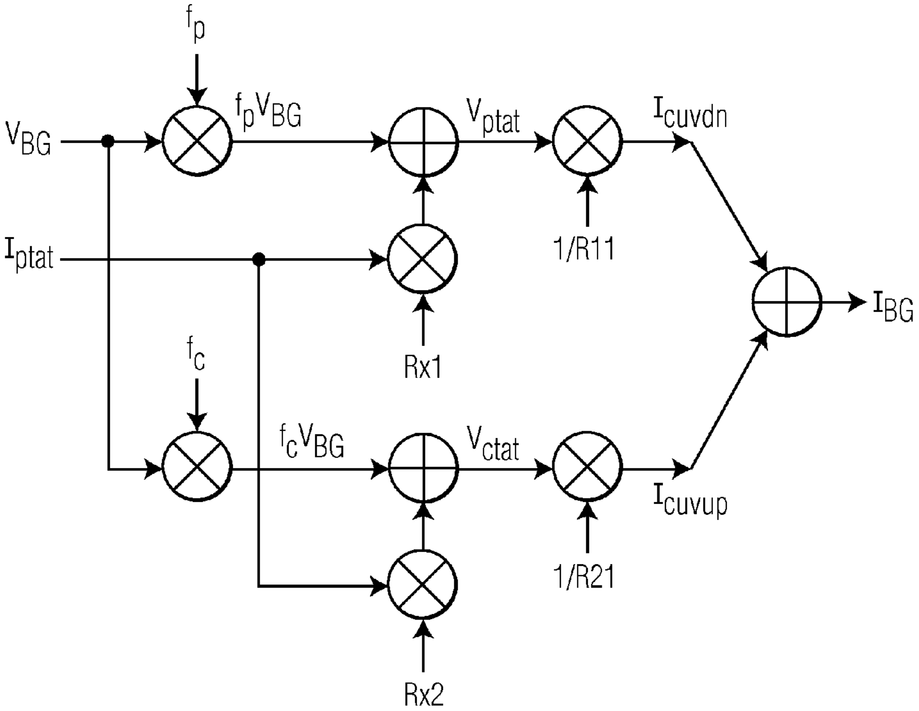
FIG. 12 is a signal diagram of some operations of the current reference generator of FIG. 5.

The overall operation of the current reference circuit 504 is illustrated in the signal diagram of FIG. 12. As illustrated in FIG. 12, the reference voltage "$V_{BG}$" from the voltage reference generator 302 is multiplied by coefficients "$f_p$" and "$f_c$" to generate two intermediate voltages "$f_pV_{BG}$" and "$f_cV_{BG}$" in the level shifter circuit 506. Currents "$I_{cuvup}$" and "$I_{cuvdn}$" are generated in the first order canceller circuit 508, based on the intermediate voltages from the level shifter circuit, the current "$I_{ptat}$" from the voltage reference generator 302, and the resistance values of the resistors "$R_{x1}$," "$R_{11}$," "$R_{x2}$," and "$R_{21}$" of the first order canceller circuit. The current "$I_{cuvdn}$," the voltage "$f_pV_{BG}$," the current "$I_{ptat}$" and the resistance values of the resistors "$R_{x1}$" and "$R_{11}$" satisfy the equation:

$$I_{cuvdn} = \frac{f_p \times V_{BG} + I_{ptat} \times R_{x1}}{R_{11}} \tag{6}$$

The current "$I_{cuvup}$," the voltage "$f_cV_{BG}$," the current "$I_{ptat}$" and the resistance values of the resistors "$R_{x2}$" and "$R_{21}$" satisfy the equation:

$$I_{cuvup} = \frac{f_c \times V_{BG} + I_{ptat} \times R_{x2}}{R_{21}} \tag{7}$$

The reference current "$I_{BG}$" is generated in the second order canceller circuit 1110 as the sum of the currents "$I_{cuvup}$" and "$I_{cuvdn}$." The current "$I_{BG}$," the voltage "$V_{BG}$," the current "$I_{ptat}$," the coefficients "$f_p$" and "$f_c$," and the resistance values of the resistors "$R_{x1}$," "$R_{11}$," "$R_{x2}$," and "$R_{21}$" satisfy the equation:

$$I_{BG} = \frac{f_p \times V_{BG} + I_{ptat} \times R_{x1}}{R_{11}} + \frac{f_c \times V_{BG} + I_{ptat} \times R_{x2}}{R_{21}} \tag{8}$$

Expressed another way, the currents "$I_{BG}$," the voltage "$V_{BG}$," the current "$I_{ptat}$," the coefficients "$f_p$" and "$f_c$," and the resistance values satisfy the equation:

$$I_{BG} = \frac{(f_p \times R_{12} + f_c \times R_{21}) + (R_{x1} \times R_{12} + R_{x2} \times R_{21}) \times I_{ptat}}{R_{11} \times R_{21}} \tag{9}$$

In equation (9), the reference current "$I_{BG}$" is correlated to the reference voltage "$V_{BG}$" because of the linear relationship between the reference current "$I_{BG}$" and the reference voltage "$V_{BG}$." By setting the coefficients "$f_p$" and "$f_c$" and the resistance values of the resistors "$R_{x1}$," "$R_{11}$," "$R_{x2}$," and "$R_{21}$," the second order curvature compensation is performed. In an embodiment, the maximum range of the reference current is set to be twice as large as the reference current that is needed to achieve a predefined accuracy of the curvature compensation of the output signal of an electric circuit that operates based on the reference voltage and the reference current from the reference circuit 100. In some embodiments, additional procedures are performed to implement second order curvature compensation.

Figure 13:
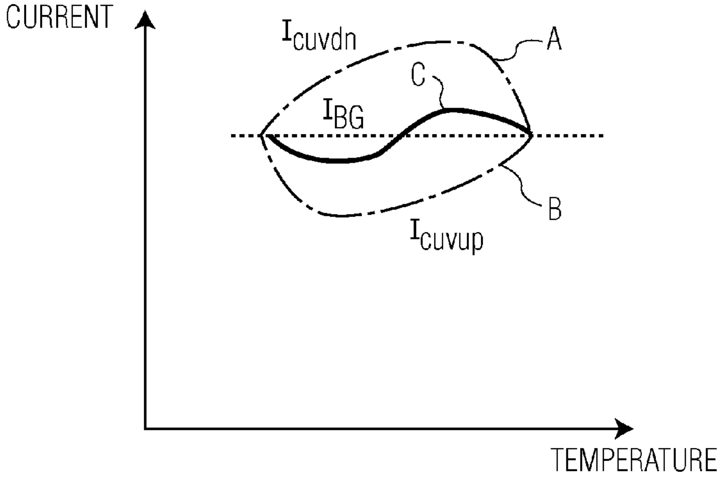
FIG. 13 is a diagram of the output current of the current reference generator of FIG. 5 as a function of the operating temperature.

FIG. 13 depicts a diagram of the output current "$I_{BG}$" of the current reference generator 504 as a function of the operating temperature. The X-axis of the diagram represents the operating temperature while the Y-axis of the diagram represents the current "$I_{BG}$." As represented by dashed curves "A" and "B," the currents "$I_{cuvdn}$" and "$I_{cuvup}$" from the PTAT canceller 824 and from the CTAT canceller 1028 change in opposite directions within the operating temperature range. However, because the reference current "$I_{BG}$" is the sum of the currents "$I_{cuvdn}$" and "$I_{cuvup}$," the variations of the currents "$I_{cuvdn}$" and "$I_{cuvup}$" can be cancelled out. As represented by curve "C" of FIG. 12, the variations of the reference current "$I_{BG}$" over the operating temperature are much smaller than the variations of the currents "$I_{cuvdn}$" and "$I_{cuvup}$."

The reference voltage and the reference current that are generated by the reference circuit 100 can be used by an oscillator to generate an oscillation signal. For example, the reference voltage and the reference current can be used by an on-chip oscillator that is fabricated along with supporting circuit elements on a single IC chip. Traditional oscillator-based curvature compensation techniques require applying curvature compensation techniques in an oscillator to keep the frequency drift of the oscillator under control. To achieve a higher accuracy and to maintain that high accuracy over a wider range of temperatures, an oscillator has to be compensated against temperature, process variation, and supply fluctuations. For example, on-chip ring oscillators are based on process/voltage/temperature (PVT) compensated delay cells.

In another example, on-chip relaxation oscillators, such as the relaxation oscillators described in Mahooti (U.S. Pat. App. Pub. 2010/0237955), are based on PVT compensated current and reference voltages. In a traditional oscillator, not only the nominal frequency has to be set, but also the drift of the frequency needs to be controlled and adjusted as well. However, controlling frequency drift over a wide temperature range can take a relatively large number of circuits, occupy a relatively large die size, and consume relatively high current. Because traditionally the drift performance of an oscillator needs to be guaranteed by the design of the oscillator, the oscillator requires some sort of curvature compensation, which means trimming and adjusting at more than one temperature point. For example, because the oscillating frequency needs to be measured and adjusted at more than one temperature, test time and the overall production cost are increased. In addition, no matter what type of oscillator is used, the drift performance of the oscillator always degrades over a wide temperature range.

The reference circuit 100 can perform first and second order curvature compensation. In particular, the reference circuit can provide a reference voltage with relatively high accuracy that has a relatively low drift over a wide temperature range. Specifically, the voltage reference generator 102 of the reference circuit utilizes a curvature compensation technique to reduce the temperature-induced drift and a frequency chopping technique to reduce the noise and offset. By applying curvature compensation, the second order effect of the reference voltage is reduced such that the reference voltage has much less drift over a wide temperature range. Also, by applying the chopping technique, the offset and noise are reduced and the reference voltage is flattened out over a wide temperature range. In addition, the reference circuit can generate a reference current that is correlated to the reference voltage using closed loop active feedback. As long as the reference voltage and the reference current follow each other, the oscillating frequency can stay constant because the oscillating frequency is dependent on the ratio between the reference voltage and the reference current. To control the oscillating frequency drift, the ratio between the reference voltage and the reference current is kept constant and compensation is made for temperature fluctuations. The low drift profile of the reference voltage results in a stable voltage/current ratio, which in turn reduces the number of temperature points at which the oscillating frequency needs to be measured and adjusted. Furthermore, the current reference generator can perform second order curvature compensation by setting its resistance values. Compared with traditional oscillator-based curvature compensation techniques, the reference-based curvature compensation techniques expand the operating temperature range for an oscillator while achieving higher accuracy for the oscillator. In particular, the accuracy of the oscillating frequency of the oscillator can be improved and the frequency drift over an operating temperature range and output noise/jitter can be reduced. Consequently, the oscillator can have a highly accurate oscillating frequency with very low and controlled frequency drift over a wide temperature range. In addition, because the reference circuit 100 can perform first and second order curvature compensation, the oscillator does not need to implement its own curvature compensation. Therefore, the oscillator can be implemented in a low cost platform. Additionally, the dimensions of the oscillator can be reduced. For example, the oscillator can be implemented in a small IC die. Furthermore, compared to oscillator-based curvature compensated techniques, the test time of the oscillator can be reduced and the test and setting procedure can be simplified because the reference circuit can perform first and second order curvature compensation.

Figure 14:
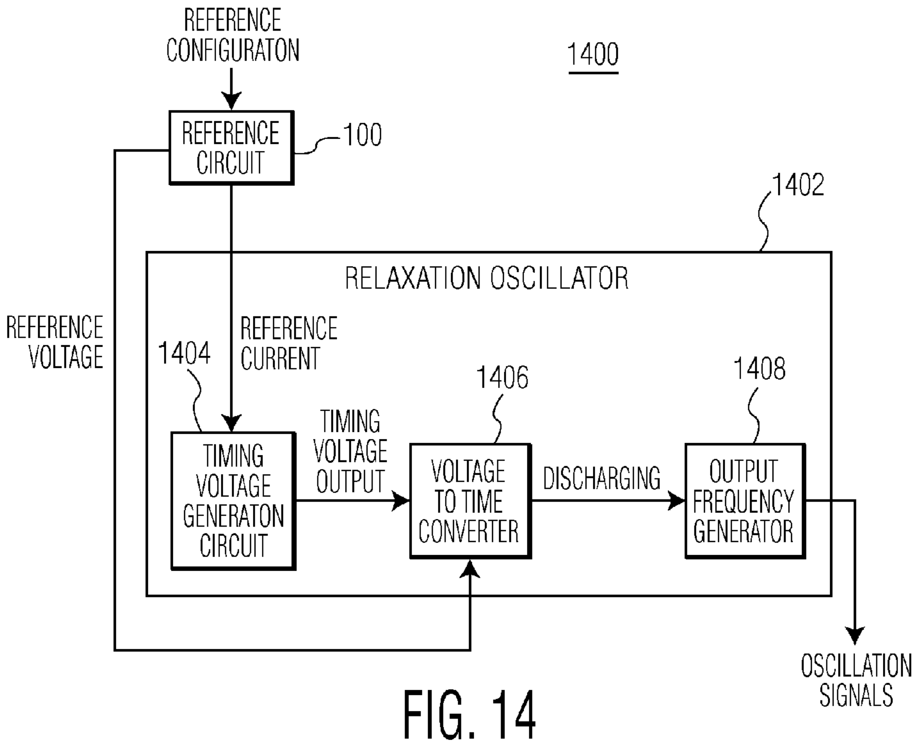
FIG. 14 is a schematic block diagram of an oscillator circuit that includes the reference circuit depicted in FIG. 1.

FIG. 14 is a schematic block diagram of an oscillator circuit 1400 that includes the reference circuit 100 depicted in FIG. 1. The oscillator circuit may be an on-chip oscillator that resides on a single IC chip and is part of a circuit such as a microcontroller. In an embodiment, the oscillator circuit includes a relaxation oscillator that operates based on charging and discharging a timing capacitor. Compared to ring oscillators, relaxation oscillators have a simpler architecture.

In the embodiment depicted in FIG. 14, the oscillator circuit 1400 includes the reference circuit 100 and a relaxation oscillator 1402 that includes a timing voltage generation circuit 1404, a voltage to time converter 1406, and an output frequency generator 1408. The timing voltage generation circuit is configured to generate a timing voltage output based on the reference current that is received from the reference circuit. In an embodiment, the timing voltage generation circuit includes multiple timing capacitor banks. The voltage to time converter is configured to generate capacitance discharging based on the timing voltage and the reference voltage that is received from the reference circuit. In an embodiment, the voltage to time converter includes multiple process, voltage, temperature (PVT) compensated comparators that compare the voltage of capacitors to the reference voltage and control the charging and discharging of the capacitor based on the comparison. The output frequency generator is configured to generate oscillation signals based on the capacitance discharging. In an embodiment, the output frequency generator includes control logic, which may include a RS latch and/or switches, to combine all of these blocks into a relaxation oscillator circuitry.

Although the oscillator circuit 1400 is depicted and described with certain components and functionality, other embodiments of the oscillator circuit may include fewer or more components to implement less or more functionality. In an embodiment, the oscillator circuit includes a current reference repeater. In this embodiment, the current reference repeater is connected to the current reference generator of the reference circuit and is configured to generate multiple reference signals that have the same current level of the reference current. In some embodiments, additional compensation is performed to account for changes on the comparator delay, changes in comparator response time, and/or changes in comparator trip level.

Figure 15:
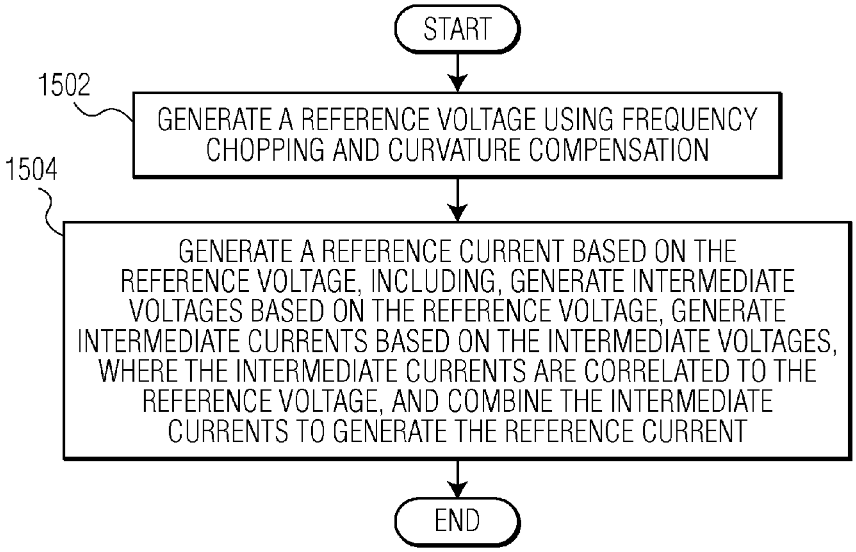
FIG. 15 is a process flow diagram of a method for operating a reference circuit in accordance with the invention.

FIG. 15 is a process flow diagram of a method for operating a reference circuit. The reference circuit may be similar to or the same as the reference circuit 100 depicted in FIG. 1. At block 1502, a reference voltage is generated using frequency chopping and curvature compensation. At block 1504, a reference current is generated based on the reference voltage. In particular, intermediate voltages are generated based on the reference voltage, intermediate currents are generated based on the intermediate voltages, where the intermediate currents are correlated to the reference voltage, and the intermediate currents are combined to generate the reference current.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments that have been described or depicted include several components described or depicted herein, other embodiments may include fewer or more components to implement less or more feature.

Furthermore, although specific embodiments have been described and depicted, the invention is not to be limited to the specific forms or arrangements of parts so described and depicted. The scope of the invention is to be defined by the claims appended hereto and their equivalents.

What is claimed is:

1. A reference circuit comprising:

a voltage reference generator configured to generate a reference voltage; and a current reference generator configured to generate a reference current based on the reference voltage, wherein the current reference generator comprises:

a level shifter circuit configured to generate a plurality of intermediate voltages based on the reference voltage;

a first current reference circuit configured to generate a plurality of intermediate currents based on the intermediate voltages, wherein the intermediate currents are correlated to the reference voltage; and a second current reference circuit configured to combine the intermediate currents to generate the reference current wherein each of the level shifter circuit, the first current reference circuit, and the second current reference circuit includes a feedback loop.

2. The reference circuit of claim 1, wherein the level shifter circuit is further configured to multiply the reference voltage by a plurality of coefficients to generate the intermediate voltages.

3. The reference circuit of claim 2, wherein the level shifter circuit includes a voltage comparator and at least three resistors that are connected to ground in series, wherein the reference voltage is input into a first input terminal of the voltage comparator, wherein a second input terminal of the voltage comparator is connected to the output terminal of the voltage comparator and the at least three resistors, and wherein the intermediate voltages are output to the first current reference circuit from terminals that are located between the at least three resistors.

4. The reference circuit of claim 2, wherein the first current reference circuit includes:

a first circuit branch that includes a first voltage regulator circuit and a first voltage to current converter circuit and is configured to generate a first intermediate current based on a first intermediate voltage of the intermediate voltages; and a second circuit branch that includes a second voltage regulator circuit and a second voltage to current converter circuit and is configured to generate a second intermediate current based on a second intermediate voltage of the intermediate voltages.

5. The reference circuit of claim 4, wherein the first voltage regulator circuit includes a voltage comparator and a resistor, wherein a current from the voltage reference generator is received at a first terminal of the resistor, wherein the first intermediate voltage is input into a first input terminal of the voltage comparator, wherein a second input terminal of the voltage comparator is connected to the output terminal of the voltage comparator and a second terminal of the resistor, and wherein a first regulated voltage is output to the first voltage to current converter circuit from the first terminal of the resistor.

6. The reference circuit of claim 5, wherein the first voltage to current converter circuit includes a second voltage comparator, a second resistor, and a first transistor, wherein the first regulated voltage is input into a first input terminal of the second voltage comparator, wherein a second input terminal of the second voltage comparator is connected to the output terminal of the second voltage comparator via the first transistor and is connected to the resistor, and wherein the first intermediate current is output to the second current reference circuit from the transistor.

7. The reference circuit of claim 6, wherein the second resistor is connected to ground.

8. The reference circuit of claim 6, wherein the second voltage regulator circuit includes a third voltage comparator and a third resistor, wherein the current from the voltage reference generator is received at a first terminal of the third resistor, wherein the second intermediate voltage is input into a first input terminal of the third voltage comparator, wherein a second input terminal of the third voltage comparator is connected to the output terminal of the third voltage comparator and a second terminal of the third resistor, and wherein a second regulated voltage is output to the second voltage to current converter circuit via the first terminal of the third resistor.

9. The reference circuit of claim 8, wherein the second voltage to current converter circuit includes a fourth voltage comparator, a fourth resistor, and a second transistor, wherein the second regulated voltage is input into a first input terminal of the fourth voltage comparator, wherein a second input terminal of the fourth voltage comparator is connected to the output terminal of the fourth voltage comparator via the second transistor and is connected to the fourth resistor, and wherein the second intermediate current is output to the second current reference circuit from the second transistor.

10. The reference circuit of claim 4, wherein the second current reference circuit includes a current mirror that is formed by a first transistor and a second transistor, wherein source terminals of the first and second transistors are connected to a voltage rail, wherein the gate terminal of the first transistor is connected to the gate terminal of the second transistor and the drain terminal of the first transistor, wherein the first and second intermediate currents are input into the drain terminal of the first transistor, and wherein the reference current is output from the drain terminal of the second transistor.

11. The reference circuit of claim 1, wherein the voltage reference generator is configured to generate the reference voltage using frequency chopping and curvature compensation.

12. An oscillator architecture comprising:

a reference circuit comprising:

a voltage reference generator configured to generate a reference voltage;

a current reference generator configured to generate a reference current based on the reference voltage, wherein the current reference generator comprises:

a level shifter circuit configured to generate a plurality of intermediate voltages based on the reference voltage;

a first current reference circuit configured to generate a plurality of intermediate currents based on the intermediate voltages, wherein the intermediate currents are correlated to the reference voltage; and a second current reference circuit configured to combine the intermediate currents to generate the reference current; and a relaxation oscillator configured to generate oscillation signals based on the reference voltage and the reference current, wherein the relaxation oscillator comprises:

a timing voltage generation circuit configured to generate a timing voltage output based on the reference current;

a voltage to time converter configured to generate a capacitance discharging based on the timing voltage and the reference voltage; and an output frequency generator configured to generate the oscillation signals based on the capacitance discharging, wherein each of the level shifter circuit, the first current reference circuit, and the second current reference circuit includes a feedback loop.

13. The oscillator architecture of claim 12, wherein the level shifter circuit is further configured to multiply the reference voltage by a plurality of coefficients to generate the intermediate voltages.

14. The oscillator architecture of claim 13, wherein the level shifter circuit includes a voltage comparator and at least three resistors that are connected to ground in series, wherein the reference voltage is input into a first input terminal of the voltage comparator, wherein a second input terminal of the voltage comparator is connected to the output terminal of the voltage comparator and the at least three resistors, and wherein the intermediate voltages are output to the first current reference circuit from terminals that are located between the at least three resistors.

15. The oscillator architecture of claim 13, wherein the first current reference circuit includes:

a first circuit branch that includes a first voltage regulator circuit and a first voltage to current converter circuit and is configured to generate a first intermediate current based on a first intermediate voltage of the intermediate voltages; and a second circuit branch that includes a second voltage regulator circuit and a second voltage to current converter circuit and is configured to generate a second intermediate current based on a second intermediate voltage of the intermediate voltages.

16. The oscillator architecture of claim 12, wherein the voltage reference generator is configured to generate the reference voltage using frequency chopping and curvature compensation.

17. A method for operating a reference circuit comprising:

generating a reference voltage using frequency chopping and curvature compensation; and generating a reference current based on the reference voltage, wherein generating the reference current comprises:

generating a plurality of intermediate voltages based on the reference voltage;

generating a plurality of intermediate currents based on the intermediate voltages, wherein the intermediate currents are correlated to the reference voltage; and combining the intermediate currents to generate the reference current, wherein the intermediate voltages, the intermediate currents, and the reference current are generated using a negative feedback loop.

* * * * *